United States Patent [19]

Dressen

[11] 4,199,734
[45] Apr. 22, 1980

[54] CRYSTAL OSCILLATOR HAVING SWITCHABLY DISABLED HARMONIC-TUNED OUTPUT CIRCUIT

[75] Inventor: Anton Dressen, Dachau, Fed. Rep. of Germany

[73] Assignee: Siemens Aktiengesellschaft, Berlin & Munich, Fed. Rep. of Germany

[21] Appl. No.: 964,336

[22] Filed: Nov. 28, 1978

[30] Foreign Application Priority Data

Dec. 2, 1977 [DE] Fed. Rep. of Germany ....... 2753879

[51] Int. Cl.² .............................................. H03B 5/36
[52] U.S. Cl. ......................................... 331/76; 331/77; 331/116 R; 331/158; 331/173
[58] Field of Search ................. 331/60, 76, 77, 116 R, 331/116 FE, 158, 172, 173

[56] References Cited

U.S. PATENT DOCUMENTS

| | | | |
|---|---|---|---|
| 2,543,456 | 2/1951 | Grisdale | 331/158 |
| 3,382,447 | 5/1968 | Racy | 331/60 |

OTHER PUBLICATIONS

Tietze et al., Halbleiter-Schaltungstechnik, Springer, Berlin, 1971, pp. 361-371.

*Primary Examiner*—Siegfried H. Grimm
*Attorney, Agent, or Firm*—Hill, Van Santen, Steadman, Chiara & Simpson

[57] ABSTRACT

An oscillator is disclosed having a one-stage amplifier and a quartz crystal resonator which operates in series resonance with a L-C oscillating circuit. An oscillating circuit which is tuned to a harmonic of the oscillator frequency is also provided which is connected via a filter device to an output of the amplifier stage. A switching device is provided which short circuits the oscillating circuit tuned to a harmonic as and when required.

8 Claims, 1 Drawing Figure

U.S. Patent
Apr. 22, 1980
4,199,734
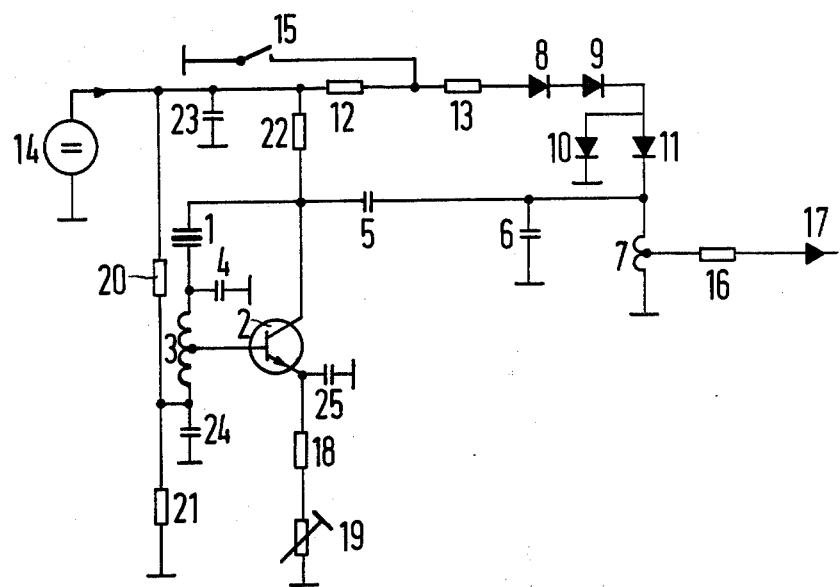

CRYSTAL OSCILLATOR HAVING SWITCHABLY DISABLED HARMONIC-TUNED OUTPUT CIRCUIT

BACKGROUND OF THE INVENTION

The invention relates to an oscillator comprising a one-stage amplifier and a quartz crystal resonator which operates in series resonance to an LC oscillating circuit.

In order to produce high frequencies with the aid of quartz crystal oscillator circuits, it is known to use harmonic quartz crystals which oscillate at a specific mechanical harmonic of the oscillating quartz crystal in oscillator circuits. As quartz crystals are very difficult to produce for very high frequencies and consequently are expensive, in specific circumstances it can be more economical to use a harmonic quartz crystal with half the desired frequency and to double this frequency for example with the aid of a following multiplier stage.

A plurality of series connected stages which are each provided with an amplifier have the disadvantage, however, that this impedes an exact tuning of the oscillating circuit to the frequency which is to be produced.

If oscillators provided with oscillating quartz crystals are used for example to drive acousto-optical deflecting devices in non-mechanical high-speed printers, it is neccessary for such oscillators to be switched on and off very rapidly. Short switching times on the order of approximately 100 ns cannot be achieved, however, in known oscillator circuits having only one stage such as disclosed in Halbleiterschaltungstechnik by Tietze and Schenk, 2nd Edition, 1971, page 371.

SUMMARY OF THE INVENTION

An object of the invention is to make available a quartz crystal oscillator having a one-stage amplifier which facilitates extremely rapid on and off switching.

This object is realized in accordance with the invention by an oscillating circuit which is turned to a harmonic of the oscillator frequency and which is connected via a filter device to an output of an amplifier stage and with a switching device which short-circuits the oscillating circuit as and when required.

In a particularly advantageous embodiment the switching device consists of a first diode path of series-connected switching diodes and a following, second diode path with parallel-connected switching diodes, one of the parallel diodes being connected to the oscillating circuit and the other of which is connected to ground potential. A switching arrangement is provided which precedes the diode paths in the blocking direction of the diodes and short-circuits the oscillating circuit as and when required by feeding the diode paths with an operating voltage.

The invention advantageously allows the production of an oscillator of very high frequency in a single stage which can nevertheless be switched extremely rapidly. The output voltage which corresponds to double the oscillator frequency is switched on and off rapidly by short-circuiting the output oscillating circuit.

This is facilitated in that the switching speed is determined only by the relatively low quality of the output circuit, whereas the quartz crystal itself continues to oscillate uninterrupted in spite of the short-circuited output circuit and consequently build-up processes which would otherwise be required can be dispensed with.

BRIEF DESCRIPTION OF THE DRAWING

The drawing is a schematic illustration of the circuit arrangement corresponding to the invention.

DESCRIPTION OF THE PREFERRED EMBODIMENTS

The oscillator which is shown in the drawing and which serves to produce HF oscillations in the frequency range from 200–250 Mhz and an on/off time of less than 100 ns consists of a harmonics quartz crystal 1 with an oscillating frequency of approximately 100–120 Mhz. This quartz crystal resonator operates in series resonance with a parallel oscillating circuit which is coupled to the base of a transistor 2 and which consists of a coil 3 and a capacitor 4. The oscillating circuit connected to the base of the transistor is not tuned to the oscillator frequency, but somewhat lower. As a result the 180° phase rotation between collector voltage and base voltage which is required for feedback is achieved. Just above its series resonance the quartz crystal in fact exhibits an inductive impedance and the base oscillating circuit operates capacitively above its parallel resonance.

The collector of the transistor 2 is connected to a small capacitor 5 which acts as a high-pass filter and couples a parallel oscillating circuit which is connected following the capacitor 5. This parallel oscillating circuit is tuned to the second harmonic of the oscillator frequency and consists of a capacitor 6 and a coil 7. This separation of multiplier and actual oscillator facilitates a very rapid switching on and off of the overall oscillator. This switching on and off is carried out with the aid of a switching device which short-circuits the oscillating circuit 6, 7 as and when required.

The switching device comprises a first diode path of series-connected switching diodes 8 and 9 and a second diode path which is arranged between the oscillating circuit and the first diode path with parallel-connected switching diodes 10 and 11. Here a diode 10 is coupled to ground, whereas the other diode 11 is connected to the oscillating circuit. The diodes are preceded in the blocking direction by a voltage divider which is composed of the resistors 12 and 13, and on the one hand is connected to an operating voltage source 14 and on the other hand to a switch 15. The switch 15 has been illustrated only by way of example. A logic switching element which is controlled in dependence upon level can also be provided, for example, in place of the switch.

The oscillating circuit 6 and 7 is short-circuited, and consequently via a resistor 16 so is the output 17 across the series connection of the diodes 10 and 11, and in fact whenever the diode 10 is conductive on account of the current with which it is impressed via the resistors 12 and 13. This is the case whenever the switch 15 is open and thus the potential 14 is present through the resistors 12, 13 and the diodes 8, 9, and 10. For such time as the switch 15 is closed and thus resistor 12 is connected to zero potential, the oscillating circuit 6, 7 is not attenuated.

The transistor current and thus the high frequency output voltage can be modified with the aid of resistors 18 and 19 arranged in the emitter circuit of the transistor 2. The tapping, illustrated in the Figure, of the coil 3 and thus of the base oscillating circuit, improves the adaptation of the collector resistance across the transistor 2 to the base resistance. This enables the regulating range of the output amplitude to be increased. The operating voltage source 14 is also connected to resistors 20, 21 and 22 and to capacitors 23 and 24 and, in the emitter circuit, a capacitor 25.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An oscillator comprising: a one-stage amplifier and a quartz crystal resonator which operates in series resonance to a LC oscillating circuit; a harmonic tuned oscillating circuit which is tuned to a harmonic of a frequency of the quartz crystal resonator and which is connected via a filter means to an output of the amplifier; and a switching means for short-circuiting the harmonic tuned oscillating circuit when required.

2. The oscillator of claim 1 wherein the switching means comprises a first diode path of series-connected switching diodes and a following second diode path with parallel-connected switching diodes, one of the parallel-connecting switching diodes being connected to the harmonic tuned oscillating circuit and another of the diodes being connected to a reference potential, and a control switch means which precedes the first and second diode paths in a blocking direction of the diodes for short-circuiting the harmonic tuned oscillating circuit when required by feeding the first and second diode paths with an operating voltage.

3. The oscillator of claim 1 wherein the switching means includes a control switch means for selectively forward biasing a diode means, said diode means being connected to short-circuit the harmonic tuned oscillating circuit.

4. An oscillator, comprising: a crystal oscillator having an LC resonant circuit; a harmonic tuned LC resonant circuit tuned to a harmonic f of an operating frequency of the crystal oscillator; an output connected to the harmonic tuned LC resonant circuit; coupling means connecting the harmonic tuned LC resonant circuit to the crystal oscillator; and switching means connected to selectively stop oscillations in the harmonic tuned LC resonant circuit and remove on oscillation signal of harmonic f from the output while said crystal oscillator continues to oscillate.

5. The oscillator of claim 4 wherein said coupling means comprises a high pass filter.

6. The oscillator of claim 4 wherein said switching means comprises means for short-circuiting the harmonic tuned LC resonant circuit.

7. The oscillator of claim 4 wherein only a single transistor is employed.

8. The oscillator of claim 4 wherein the crystal oscillator has a quartz crystal operating in harmonic fashion.

* * * * *